United States Patent
Huang et al.

(10) Patent No.: US 10,624,427 B2
(45) Date of Patent: Apr. 21, 2020

(54) SMART ZIPPER AND METHOD THEREOF

(71) Applicant: Quanta Computer Inc., Taoyuan (TW)

(72) Inventors: Cheng-Han Huang, Taoyuan (TW);
Mao-Chen Hsiao, Taoyuan (TW);
Jen-Chih Shih, Taoyuan (TW); Tse-An Lin, Taoyuan (TW)

(73) Assignee: QUANTA COMPUTER INC., Guishan Dist., Taoyuan (TW)

( * ) Notice: Subject to any disclaimer, the term of this patent is extended or adjusted under 35 U.S.C. 154(b) by 273 days.

(21) Appl. No.: 15/665,553

(22) Filed: Aug. 1, 2017

(65) Prior Publication Data

US 2018/0325223 A1    Nov. 15, 2018

(30) Foreign Application Priority Data

May 10, 2017    (TW) .............................. 106115427 A

(51) Int. Cl.
*A44B 19/26*    (2006.01)
*G01R 19/00*    (2006.01)
*G01R 19/165*    (2006.01)
*A44B 19/24*    (2006.01)

(52) U.S. Cl.
CPC .............. *A44B 19/26* (2013.01); *A44B 19/24* (2013.01); *G01R 19/0046* (2013.01); *G01R 19/0084* (2013.01); *G01R 19/16566* (2013.01)

(58) Field of Classification Search
CPC .. A41D 1/002; A41D 1/005; A41D 2300/322; H01H 2001/125; H01H 1/12
See application file for complete search history.

(56) References Cited

U.S. PATENT DOCUMENTS

| | | | | |
|---|---|---|---|---|
| 3,753,201 | A * | 8/1973 | Ohman | H01C 10/08 338/92 |
| 9,231,327 | B1 * | 1/2016 | Liu | H01R 13/22 |
| 2002/0005340 | A1 * | 1/2002 | Marmaropoulos | H01H 1/12 200/61.58 R |
| 2006/0103641 | A1 * | 5/2006 | Marhefka | G02F 1/1345 345/204 |
| 2006/0164280 | A1 | 7/2006 | Nehls et al. | |
| 2018/0047526 | A1 * | 2/2018 | Tourrette | H01H 9/54 |
| 2018/0068549 | A1 * | 3/2018 | Tourrette | A44B 19/24 |

FOREIGN PATENT DOCUMENTS

CN        105361365 A        3/2016

OTHER PUBLICATIONS

Chinese language office action dated Jul. 19, 2017, issued in application No. TW 106115427.

* cited by examiner

*Primary Examiner* — Lee E Rodak
*Assistant Examiner* — Adam S Clarke
(74) *Attorney, Agent, or Firm* — McClure, Qualey & Rodack, LLP

(57) ABSTRACT

A smart zipper includes a zipper, a voltage generator, a voltage detector, and a processor. The zipper includes a first left tooth and a first right tooth. The first left tooth is electrically connected to a first left wire and is supplied with a supply voltage. The first right tooth is electrically connected to a first right wire. The voltage generator generates the supply voltage. The voltage detector detects the voltage of the first right wire to generate a first detection signal. The processor determines first coupling information about whether the first left tooth is electrically connected to the first right tooth, according to the first detection signal.

10 Claims, 3 Drawing Sheets

SMART ZIPPER AND METHOD THEREOF

CROSS REFERENCE TO RELATED APPLICATIONS

This Application claims priority of Taiwan Patent Application No. 106115427, filed on May 10, 2017, the entirety of which is incorporated by reference herein.

BACKGROUND OF THE INVENTION

Field of the Invention

The disclosure relates generally to a zipper and a method of detecting the position of the pull-tab of the zipper.

Description of the Related Art

Everyone uses at least one zipper every day. However, as security requirements increase, the ability to monitor the open/closed status of a zipper is becoming an urgent problem.

BRIEF SUMMARY OF THE INVENTION

In an embodiment, a smart zipper comprises: a zipper, a voltage generator, a voltage detector, and a processor. The zipper comprises: a first left tooth and a first right tooth. The first left tooth is electrically connected to a first left wire and is supplied with a supply voltage. The first right tooth is electrically connected to a first right wire. The voltage generator generates the supply voltage. The voltage detector detects the voltage of the first right wire to generate a first detection signal. The processor determines first coupling information about whether the first left tooth is coupled to the first right tooth according to the first detection signal.

According to an embodiment of the invention, when the voltage detector detects that the voltage of the first right wire is the supply voltage, the processor determines that the first left tooth is coupled to the first right tooth, wherein when the voltage detector detects that the voltage of the first right wire is not equal to the supply voltage, the processor determines that the first left tooth is not coupled to the first right tooth.

According to an embodiment of the invention, the zipper further comprises: a second left tooth and a second right tooth. The second left tooth is electrically connected to a second left wire and is supplied with the supply voltage. The second right tooth is electrically connected to a second right wire. The voltage detector further detects the voltage of the second right wire to generate a second detection signal, and the processor determines second coupling information about whether the second left tooth is coupled to the second right tooth according to the second detection signal. The processor determines the open/closed status of the zipper according to the first coupling information and the second coupling information.

According to an embodiment of the invention, the zipper further comprises: a third left tooth and a third right tooth. The third left tooth is placed between the first left tooth and the second left tooth and is electrically connected to a third left wire supplied by the supply voltage. The third right tooth is placed between the first right tooth and the second right tooth and is electrically connected to a third right wire. The voltage detector detects the third right wire to generate a third detection signal. The processor determines third coupling information about whether the third left tooth is coupled to the third right tooth. When the processor determines that the first left tooth and the second left tooth are respectively coupled to the first right tooth and the second right tooth but the third left tooth is not coupled to the third right tooth, the processor determines that the zipper is in a partially-separated state.

According to an embodiment of the invention, the smart zipper further comprises: a memory. The memory is configured to store the first detection signal, the second detection signal, and the third detection signal. The processor accesses the memory to determine the open/closed status.

In an embodiment, a position-detecting method adopted in a zipper, wherein the zipper comprises a first left tooth and a first right tooth, comprises: supplying a supply voltage to the first left tooth; detecting a voltage of the first right tooth to generate a first detection signal; and determining first coupling information about whether the first left tooth is coupled to the first right tooth according to the first detection signal.

According to an embodiment of the invention, the position-detecting method further comprises: determining that the first left tooth is coupled to the first right tooth when the voltage of the first right tooth is equal to the supply voltage; and determining that the first left tooth is not coupled to the first right tooth when the voltage of the first right tooth is not equal to the supply voltage.

According to an embodiment of the invention, the zipper further comprises a second left tooth and a second right tooth, wherein the position-detecting method further comprises: supplying the supply voltage to the second left tooth; detecting a voltage of the second right tooth to generate a second detection signal; determining second coupling information about whether the second left tooth is coupled to the second right tooth according to the second detection signal; and determining the open/closed status of the zipper according to the first coupling information and the second coupling information.

According to an embodiment of the invention, the zipper comprises a third left tooth and a third right tooth, wherein the position-detecting method further comprises: supplying the supply voltage to the third left tooth, wherein the third left tooth is placed between the first left tooth and the second left tooth; detecting the voltage of the third right tooth to generate a third detection signal, wherein the third right tooth is placed between the first right tooth and the second right tooth; determining third coupling information about whether the third left tooth is coupled to the third right tooth according to the third detection signal; and determining that the zipper is in a partially-separated state when the first left tooth and the second left tooth are respectively coupled to the first right tooth and the second right tooth but the third left tooth is not coupled to the third right tooth.

According to an embodiment of the invention, the position-detecting method further comprises: storing the first detection signal, the second detection signal, and the third detection signal in a memory; and accessing the memory to determine the open/closed status.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
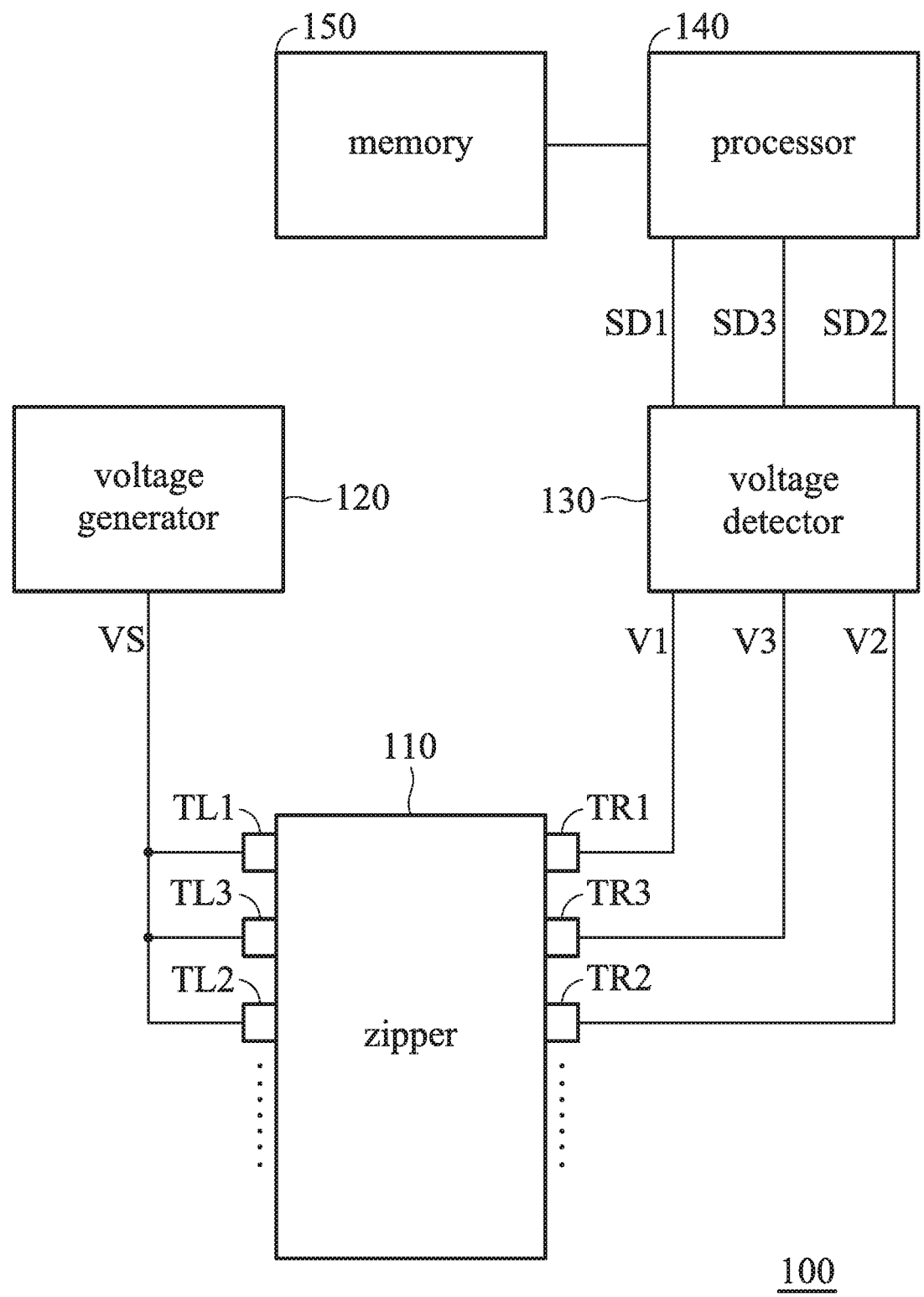
FIG. 1 is a block diagram of a smart zipper in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a block diagram of a smart zipper in accordance with an embodiment of the disclosure. As shown in FIG. 1, the smart zipper 100 includes a zipper 110, a voltage generator 120, a voltage detector 130, a processor 140, and a memory 150. According to an embodiment of the disclosure, the zipper 110 includes a first left tooth TL1, a first right tooth TR1, a second left tooth TL2, a second right tooth TR2, a third left tooth TL3, and a third right tooth TR3, in which the first left tooth TL1, the second left tooth TL2, and the third left tooth TL3 are respectively configured to be electrically coupled to the first right tooth TR1, the second right tooth TR2, and the third right tooth TR3 when the zipper 110 is closed. According to other embodiments of the disclosure, the zipper 110 includes a plurality of left teeth and a plurality of right teeth. The first left tooth TL1, the second left tooth TL2, the third left tooth TL3, the first right tooth TR1, the second right tooth TR2, and the third right tooth TR3 are illustrated herein. It is not intended to limit the scope of the disclosure to any type or shape.

The voltage generator 120 is configured to generate the supply voltage VS which is applied to the first left tooth TL1, the second left tooth TL2, and the third left tooth TL3. The voltage detector 130 is configured to detect the first voltage V1 of the first right tooth TR1, the second voltage V2 of the second right tooth TR2, and the third voltage V3 of the third right tooth TR3 to respectively generate a first detection signal SD1, a second detection signal SD2, and the third detection signal SD3.

The memory 150 is configured to store the first detection signal SD1, the second detection signal SD2, the third detection signal SD3. The processor 140 accesses the first detection signal SD1, the second detection signal SD2, and the third detection signal SD3 stored in the memory 150 and determines whether the first left tooth TL1, the second left tooth TL2, and the third left tooth TL3 are respectively electrically connected to the first right tooth TR1, the second right tooth TR2, and the third right tooth TR3 according to the first detection signal SD1, the second detection signal SD2, and the third detection signal SD3.

According to some embodiments of the disclosure, the memory 150 includes, for example, random access memory (RAM), read-only memory (ROM), hard drive, solid-state drive, USB flash drive, memory card, optical disc such as compact disc (CD) or digital versatile disc (DVD), floppy disk, magnetic tape, or another memory component. In addition, the RAM may include, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or another similar memory device.

Figure 2:
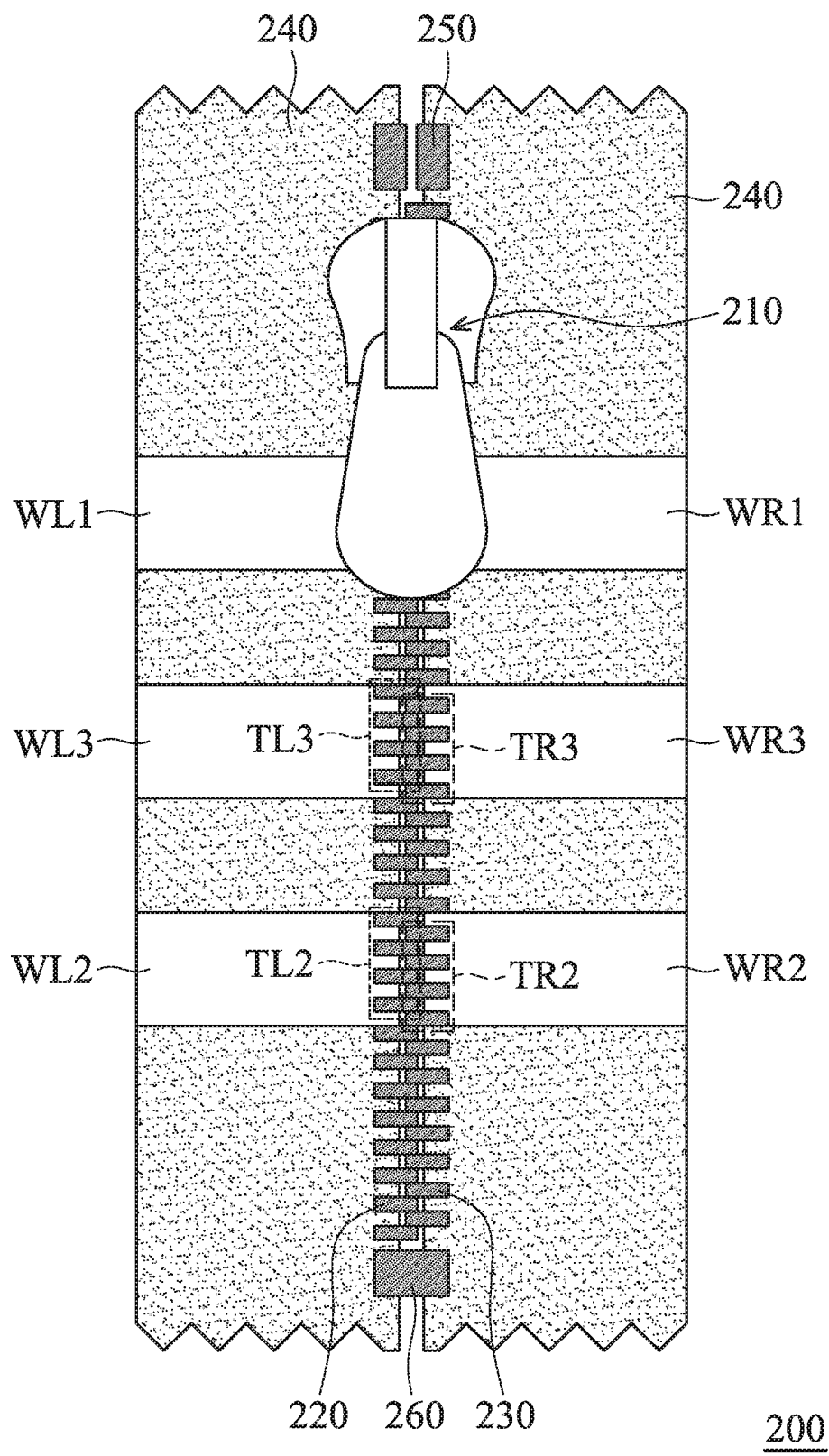
FIG. 2 is a schematic diagram of a zipper in accordance with an embodiment of the invention.

FIG. 2 is a schematic diagram of a zipper in accordance with an embodiment of the disclosure. As shown in FIG. 2, the zipper 200 corresponds to the zipper 110 in FIG. 1, in which the zipper 200 includes a pull-tab 210, a plurality of left teeth 220, a plurality of right teeth 230, a tape 240, a top stop 250, and a bottom stop 260. The pull-tab 210 slides between the top stop 250 and the bottom stop 260. The pull-tab 210 is configured to connect the left teeth 220 together with the right teeth 230, as well as to separate the left teeth 220 and the right teeth 230 from each other.

The left teeth 220 include the first left tooth TL1 (not shown in FIG. 2), the second left tooth TL2, and the third left tooth TL3, in which the first left tooth TL1, the second left tooth TL2, and the third left tooth TL3 are made of a conductive material, and the other left teeth are not conductive.

The right teeth 230 include the first right tooth TR1 (not shown in FIG. 2), the second right tooth TR2, and the third right tooth TR3, in which the first right tooth TR1, the second right tooth TR2, and the third right tooth TR3 are made of a conductive material, and the other right teeth are not conductive.

The tape 240 includes a first right wire WR1, a first left wire WL1, a second right wire WR2, a second left wire WL2, a third right wire WR3, and a third left wire WL3, which are conductive and could be implemented by conductive wires embedded in the sewing threads. According to an embodiment of the disclosure, the tape 240 is nonconductive which could incorporate the first right wire WR1, the first left wire WL1, the second right wire WR2, the second left wire WL2, the third right wire WR3, and the third left wire WL3 by weaving, sewing, sticking, or a similar method. According to an embodiment of the disclosure, the first right wire WR1, the first left wire WL1, the second right wire WR2, the second left wire WL2, the third right wire WR3, and the third left wire WL3 are respectively electrically connected to the voltage generator 120 and the voltage detector 130 in FIG. 1 through one or several conductive wires by welding, buckling, riveting, sewing, or a similar method.

According to an embodiment of the disclosure, the first right wire WR1, the second right wire WR2, and the third right wire WR3 are respectively electrically connected to the first right tooth TR1 (not shown in FIG. 2), the second right tooth TR2, and the third right tooth TR3. The first left wire WL1, the second left wire WL2, and the third wire WL3 are respectively electrically connected to the first left tooth TL1 (not shown in FIG. 2), the second left tooth TL2, and the third left tooth TL3.

According to an embodiment of the disclosure, the first left tooth TL1, the second left tooth TL2, and the third left tooth TL3 are respectively supplied by the supply voltage VS generated by the voltage generator 120 in FIG. 1 through the first left wire WL1, the second left wire WL2, and the third left wire WL3. The voltage detector 130 in FIG. 1 respectively detects the first voltage V1 of the first right tooth TR1, the second voltage V2 of the second right tooth TR2, and the third voltage V3 of the third right tooth TR3 through the first right wire WR1, the second right wire WR2, and the third right wire WR3 to generate the corresponding first detection signal SD1, second detection signal SD2, and third detection signal SD3.

FIG. 1 combined with FIG. 2 is described in the following paragraphs to explain the action of the smart zipper 100 in detail. For instance, the pull-tab 210 in FIG. 2 moves in the moving range defined by the top stop 250 and the bottom stop 260, in which the moving range of the pull-tab 210 is divided into four equal parts by the first right wire WR1, the second right wire WR2, and the third right wire WR3.

According to an embodiment of the disclosure, when the first left tooth TL1 is coupled to the first right tooth TR1 by the pull-tab 210, the first left wire WL1 is electrically connected to the first right wire WR1 through the first left tooth TL1 and the first right tooth TR1. Therefore, when the processor 140 determines that the first voltage V1 is equal to, or almost equal to, the supply voltage VS according to the first detection signal SD1, the processor 140 determines that the first left tooth TL1 is coupled to the first right tooth TR1. According to an embodiment of the disclosure, when the difference between the first voltage V1 and the supply voltage VS is less than 30%, the first voltage V1 is determined to be equal to, or almost equal to, the supply voltage VS.

According to another embodiment of the disclosure, when the processor 140 in FIG. 1 determines that the first voltage V1 is not equal to the supply voltage VS according to the first detection signal SD1, the processor 140 determines that the first left tooth TL1 is not coupled to the first right tooth TR1. According to an embodiment of the disclosure, when the difference between the first voltage V1 and the supply voltage VS exceeds 30%, the first voltage V1 is determined to be not equal to the supply voltage VS.

According to an embodiment of the disclosure, when the processor 140 determines that the first left tooth TL1 is coupled to the first right tooth TR1, since the moving range of the pull-tab 210 is divided into four equal parts by the first right wire WR1, the second right wire WR2, and the third right wire WR3, the processor 140 determines that the open/closed status of the zipper 200 is 25% (or 75%). The moving range of the pull-tab 210 being divided into four parts as described herein is merely an illustration and is not intended to limit the scope of the disclosure.

According to another embodiment of the disclosure, when the processor 140 determines, according to the first detection signal SD1, that the first left tooth TL1 is coupled to the first right tooth TR1 and determines, according to the third detection signal SD3, that the third left tooth TL3 is coupled to the third right tooth TR3, the processor 140 determines that the open/closed status of the zipper 200 is 50%.

According to another embodiment of the disclosure, when the processor 140 determines that the first left tooth TL1 and the second left tooth TL2 are respectively coupled to the first right tooth TR1 and the second right tooth TR2 but the third left tooth TL3 is not coupled to the third right tooth TR3, the processor 140 determines that the open/closed status of the zipper 200 is partially-separated and generates an alert signal for informing the user, thus resulting in increased security and informing the user whether the zipper 200 is working well.

According to an embodiment of the disclosure, the smart zipper 100 in FIG. 1 could be applied to a suitcase. When the processor 140 determines that the open/closed status of the zipper 110 in FIG. 1 and the zipper 200 in FIG. 2 is a partially-separated state, an alert signal is generated to inform the user that the suitcase is being opened due to unknown reasons, or that the suitcase may be destroyed.

Figure 3:
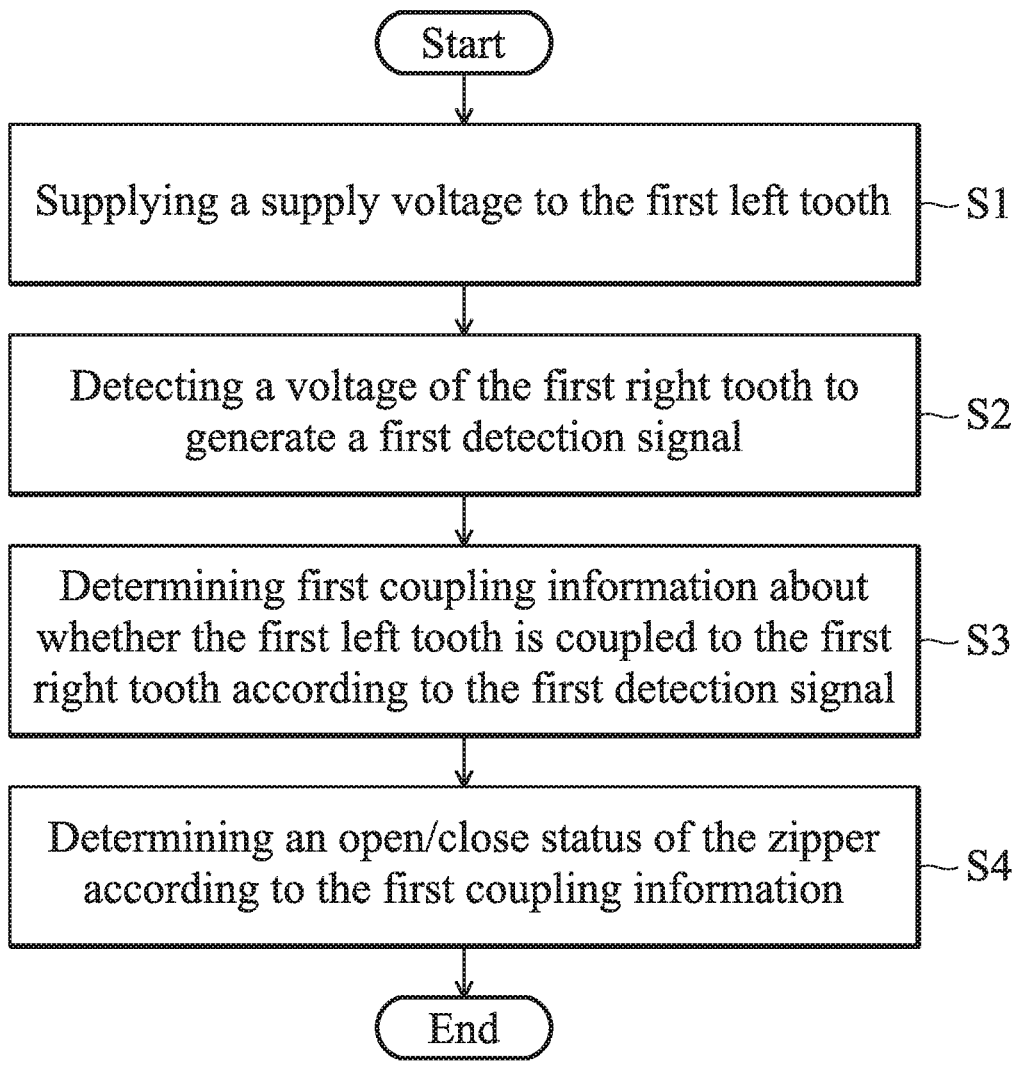
FIG. 3 is a flow chart of a position-detecting method in accordance with an embodiment of the invention.

FIG. 3 is a flow chart of a position-detecting method in accordance with an embodiment of the disclosure. The following description of the flow chart in FIG. 3 will be described with FIGS. 1 and 3 for the convenience of explanation. The first left tooth TR1 is supplied by the supply voltage VS (Step S1). Then, the first voltage V1 of the first right tooth TR1 is detected to generate the first detection signal SD1 (Step S2); the first coupling information about whether the first left tooth TL1 is coupled to the first right tooth TR1 is determined according to the first detection signal SD1 (Step S3). The open/closed status of the zipper 200 is determined according to the first coupling information (Step S4).

The user is able to clearly know the open/closed status of the zipper using the smart zipper and the position-detecting method provided herein, thereby increasing security.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A smart zipper, comprising:
a zipper, comprising:
a first left tooth, electrically connected to a first left wire and supplied with a supply voltage;
a first right tooth, electrically connected to a first right wire;
a second left tooth, electrically connected to a second left wire and supplied with the supply voltage, wherein at least one non-conductive tooth is placed between the first left tooth and the second left tooth; and
a second right tooth, electrically connected to a second right wire, wherein at least one non-conductive tooth is placed between the first right tooth and the second right tooth;
a third left tooth, placed between the first left tooth and the second left tooth and electrically connected to a third left wire supplied by the supply voltage; and
a third right tooth, placed between the first right tooth and the second right tooth and electrically connected to a third right wire;
a voltage generator, generating the supply voltage;
a voltage detector, detecting a voltage of the first right wire to generate a first detection signal, detecting a voltage of the second right wire to generate a second detection signal, and detecting the third right wire to generate a third detection signal; and
a processor, determining first coupling information about whether the first left tooth is coupled to the first right tooth according to the first detection signal, determining second coupling information about whether the second left tooth is coupled to the second right tooth according to the second detection signal, and determining third coupling information about whether the third left tooth is coupled to the third right tooth, wherein when the processor determines that the first left tooth and the second left tooth are respectively coupled to the first right tooth and the second right tooth but the third left tooth is not coupled to the third right tooth, the processor determines that the zipper is in a partially-separated state.

2. The smart zipper of claim 1, wherein when the voltage detector detects that the voltage of the first right wire is equal to the supply voltage, the processor determines that the first left tooth is coupled to the first right tooth, wherein when the voltage detector detects that the voltage of the first right wire is not equal to the supply voltage, the processor determines that the first left tooth is not coupled to the first right tooth.

3. The smart zipper of claim 1, wherein the processor determines an open/closed status of the zipper according to the first coupling information and the second coupling information.

4. The smart zipper of claim 3, further comprising:
a memory, configured to store the first detection signal, the second detection signal, and the third detection signal, wherein the processor accesses the memory to determine the open/closed status.

5. The smart zipper of claim 1, wherein at least one non-conductive tooth is placed among the first left tooth, the second left tooth, and the third left tooth, wherein at least one non-conductive tooth is placed among the first right tooth, the second right tooth, and the third right tooth.

6. A position-detecting method, adopted in a zipper, wherein the zipper comprises a first left tooth, a second left tooth, a third left tooth, a first right tooth, a second right tooth, and a third right tooth, wherein at least one non-conductive tooth is placed between the first left tooth and the second left tooth and at least one non-conductive tooth is placed between the first right tooth and the second right tooth, wherein the position-detecting method comprises:
supplying a supply voltage to the first left tooth;
detecting a voltage of the first right tooth to generate a first detection signal;
supplying the supply voltage to the second left tooth;
detecting a voltage of the second right tooth to generate a second detection signal;
supplying the supply voltage to the third left tooth, wherein the third left tooth is placed between the first left tooth and the second left tooth;
detecting a voltage of the third right tooth to generate a third detection signal, wherein the third right tooth is placed between the first right tooth and the second right tooth;
determining first coupling information about whether the first left tooth is coupled to the first right tooth according to the first detection signal;
determining second coupling information about whether the second left tooth is coupled to the second right tooth according to the second detection signal;
determining third coupling information about whether the third left tooth is coupled to the third right tooth according to the third detection signal; and
determining that the zipper is in a partially-separated state when the first left tooth and the second left tooth are respectively coupled to the first right tooth and the second right tooth but the third left tooth is not coupled to the third right tooth.

7. The position-detecting method of claim 6, further comprising:
determining that the first left tooth is coupled to the first right tooth when the voltage of the first right tooth is equal to the supply voltage; and
determining that the first left tooth is not coupled to the first right tooth when the voltage of the first right tooth is not equal to the supply voltage.

8. The position-detecting method of claim 6, wherein the position-detecting method further comprises:
determining an open/closed status of the zipper according to the first coupling information and the second coupling information.

9. The position-detecting method of claim 6, further comprising:
storing the first detection signal, the second detection signal, and the third detection signal in a memory; and
accessing the memory to determine the open/closed status.

10. The position-detecting method of claim 6, wherein at least one non-conductive tooth is placed among the first left tooth, the second left tooth, and the third left tooth, wherein at least one non-conductive tooth is placed among the first right tooth, the second right tooth, and the third right tooth.

* * * * *